US 9,991,888 B2

(12) United States Patent
Heo et al.

(10) Patent No.: US 9,991,888 B2
(45) Date of Patent: Jun. 5, 2018

(54) DRIVING CIRCUIT

(71) Applicant: SAMSUNG ELECTRO-MECHANICS CO., LTD., Suwon-si (KR)

(72) Inventors: Chang Jae Heo, Suwon-si (KR); Sung Man Pang, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 10 days.

(21) Appl. No.: 15/264,713

(22) Filed: Sep. 14, 2016

(65) Prior Publication Data

US 2017/0187374 A1 Jun. 29, 2017

(30) Foreign Application Priority Data

Dec. 24, 2015 (KR) .................. 10-2015-0186802

(51) Int. Cl.
| | | |
|---|---|---|
| *H01L 27/092* | (2006.01) | |
| *H03K 3/012* | (2006.01) | |
| *H03K 17/687* | (2006.01) | |
| *H01L 29/78* | (2006.01) | |

(52) U.S. Cl.
CPC ....... *H03K 17/6872* (2013.01); *H01L 27/092* (2013.01); *H01L 29/7817* (2013.01); *H03K 3/012* (2013.01); *H03K 2217/0063* (2013.01)

(58) Field of Classification Search
CPC .............. H03K 17/6872; H03K 3/012; H03K 2217/0063; H01L 27/092; H01L 29/7817

USPC ..... 327/108–112, 379, 389, 391; 326/22–27, 326/81–87

See application file for complete search history.

(56) References Cited

U.S. PATENT DOCUMENTS

| | | | | |
|---|---|---|---|---|
| 6,057,726 A | * | 5/2000 | Sumida ................ | H03F 3/3001 326/68 |
| 7,212,036 B2 | * | 5/2007 | Kasuya .............. | H03K 17/0822 318/4 |
| 9,240,402 B2 | * | 1/2016 | Masliah .............. | H01L 29/7832 |
| 9,461,539 B2 | * | 10/2016 | Chern ................... | H02M 3/156 |
| 2005/0179463 A1 | * | 8/2005 | Kasuya ............... | H03K 17/0822 326/83 |

(Continued)

FOREIGN PATENT DOCUMENTS

JP 2001-177388 A 6/2001

*Primary Examiner* — Brandon S Cole
(74) *Attorney, Agent, or Firm* — NSIP Law

(57) ABSTRACT

A driving circuit includes a first switching element operating in a turned-on state or a turned-off state depending on a control voltage; a second switching element operating complementarily to the first switching element depending on the control voltage; a constant voltage circuit unit turning on depending on a source-gate voltage of the first switching element to maintain a constant voltage; a current adjusting circuit operating in a turned-on state or a turned-off state depending on the control voltage, and adjusting an operating current flowing to a ground depending on a current control signal in the turned-on state of the current adjusting circuit; a current control circuit controlling the operating current by providing the current control signal to the current adjusting circuit in a turned-on state of the constant voltage circuit unit; and a signal transfer circuit providing the control voltage to a gate of the second switching element.

16 Claims, 10 Drawing Sheets

(56) References Cited

U.S. PATENT DOCUMENTS

| | | | |
|---|---|---|---|
| 2011/0248751 A1* | 10/2011 | Sinow | H03K 17/6871 327/109 |
| 2014/0266118 A1* | 9/2014 | Chern | H02M 3/156 323/283 |
| 2015/0256171 A1* | 9/2015 | Wong | H03K 17/687 327/415 |
| 2016/0336442 A1* | 11/2016 | Nielsen | H01L 21/82389 |
| 2017/0148873 A1* | 5/2017 | Kim | H01L 29/0642 |
| 2017/0271195 A1* | 9/2017 | Hoyerby | H01L 21/761 |

* cited by examiner

DRIVING CIRCUIT

CROSS-REFERENCE TO RELATED APPLICATIONS

This application claims the benefit under 35 USC 119(a) of Korean Patent Application No. 10-2015-0186802 filed on Dec. 24, 2015, in the Korean Intellectual Property Office, the entire disclosure of which is incorporated herein by reference for all purposes.

BACKGROUND

1. Field

The following description relates to a driving circuit using a metal-oxide-semiconductor field-effect transistor (MOSFET) and a lateral double-diffused (LD) MOSFET (hereinafter referred to as an LD-MOS).

2. Description of Related Art

Generally, a driving circuit constituted by a metal-oxide-semiconductor (MOS) integrated circuit may be used in an electronic device generating a driving signal. In this case, the driving circuit should be designed in consideration of a voltage level of a required driving signal.

In a case in which it is required to provide a driving signal having a voltage level higher than a specific voltage of a defined specific voltage process using a driving circuit manufactured by the defined specific voltage process among existing driving circuits, a lateral double-diffused MOSFET (LD-MOS) having good driving capability may be used.

However, in a driving circuit using the LD-MOS, a high operating voltage (VPP) is used, which may cause a breakdown in a switching element.

Existing driving circuits using the LD-MOS as described include an inverter type driving circuit using a P-channel LD-MOS and an N-channel LD-MOS.

This driving circuit includes a Zener diode connected between an operating voltage terminal and a gate of the P-channel LD-MOS to prevent a breakdown of the P-channel LD-MOS, and a one-shot pulse circuit for controlling a switching element connected between the gate of the P-channel LD-MOS and a ground to switch into a turned-on state during a predetermined short period of time to improve current consumption.

However, when a width of a one-shot signal generated by the one-shot pulse circuit is excessively narrow, the P-channel LD-MOS may not switch into the turned-on state.

In contrast, when a width of the one-shot signal is excessively wide, a high current flows for a predetermined period of time and continues to flow even after the P-channel LD-MOS has switched into the turned-on state, thereby increasing power consumption. However, variations in many and complicated processes such as an operating temperature of the LD-MOS, manufacturing of the LD-MOS, or the like, should be considered to appropriately design a pulse width of the one-shot signal. As a result, the pulse width may not be designed to be narrow, and a design should be considered so that the pulse width has some degree of margin. Therefore, unnecessary power consumption may occur.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a driving circuit includes a first switching element connected between an operating voltage terminal and an output terminal and configured to operate in a turned-on state or a turned-off state depending on a control voltage; a second switching element connected between the output terminal and a ground and configured to operate in a turned-on state or a turned-off state complementarily to the first switching element depending on the control voltage; a constant voltage circuit unit connected between the operating voltage terminal and a gate of the first switching element and configured to turn on depending on a source-gate voltage of the first switching element to maintain a constant voltage between the operating voltage terminal and the gate of the first switching element; a current adjusting circuit connected between the gate of the first switching element and the ground and configured to operate in a turned-on state or a turned-off state depending on the control voltage, and adjust an operating current flowing to the ground depending on a current control signal based on a level of the source-gate voltage of the first switching element in the turned-on state of the current adjusting unit; a current control circuit configured to control the operating current by providing the current control signal to the current adjusting circuit in a turned-on state of the constant voltage circuit unit; and a signal transfer circuit configured to provide the control voltage to a gate of the second switching element.

The operating current may include a first current flowing to the ground through a parasitic capacitor between a source and the gate of the first switching element and the current adjusting circuit in a turned-off state of the constant voltage circuit unit; and a second current flowing to the ground through the constant voltage circuit unit and the current adjusting circuit in the turned-on state of the constant voltage circuit unit; and a value of the second current may be less than a value of the first current.

The constant voltage circuit unit may include a resistor circuit having one end connected to the operating voltage terminal; and a constant voltage circuit connected between another end of the resistor circuit and the gate of the first switching element and configured to turn depending on the source-gate voltage of the first switching element to maintain the constant voltage between the operating voltage terminal and the gate of the first switching element.

The resistor circuit may include a first resistor; the constant voltage circuit may include a Zener diode; and a sum of a breakdown voltage of the Zener diode and a voltage across the first resistor may be lower than a source-gate breakdown voltage of the first switching element.

The current control circuit may include a second PMOS having a source connected to the operating voltage terminal, a gate connected to a connection node between the constant voltage circuit and the resistor circuit, and a drain; and a third resistor connected between the drain of the second PMOS and the ground and configured to provide the current control signal to the current adjusting circuit.

The current adjusting circuit may include a first N-channel metal-oxide-semiconductor (NMOS), a second resistor, and a first P-channel metal-oxide-semiconductor (PMOS) connected to each other in series between the gate of the first switching element and the ground; the first NMOS may be configured to operate in a turned-on state or a turned-off state depending on the control voltage; and the first PMOS may be configured to operate in synchronization with an operation of the first NMOS and reduce the operating current flowing to the ground depending on a voltage level of the current control signal.

In another general aspect, a driving circuit includes a P-channel lateral double-diffused metal-oxide-semiconductor (LD-MOS) connected between an operating voltage terminal and an output terminal and configured to operate in a turned-on state or a turned-off state depending on a control voltage; an N-channel LD-MOS connected between the output terminal and a ground and configured to operate complementarily to the P-channel LD-MOS depending on the control voltage; a constant voltage circuit unit connected between the operating voltage terminal and a gate of the P-channel LD-MOS and configured to turn on depending on a source-gate voltage of the P-channel LD-MOS to maintain a constant voltage between the operating voltage terminal and the gate of the P-channel LD-MOS; a current adjusting circuit connected between the gate of the P-channel LD-MOS and the ground and configured to operate in a turned-on state or a turned-off state depending on the control voltage, and adjust an operating current flowing to the ground depending on a current control signal based on a level of the source-gate voltage of the P-channel LD-MOS in the turned-on state of the current adjusting unit; a current control circuit configured to control the operating current by providing the current control signal to the current adjusting circuit in a turned-on state of the constant voltage circuit unit; and a signal transfer circuit configured to provide the control voltage to a gate of the N-channel LD-MOS.

The operating current may include a first current flowing to the ground through a parasitic capacitor between a source and the gate of the P-channel LD-MOS and the current adjusting circuit in a turned-off state of the constant voltage circuit unit; and a second current flowing to the ground through the constant voltage circuit unit and the current adjusting circuit in the turned-on state of the constant voltage circuit unit; and a value of the second current may be lower than a value of the first current.

The constant voltage circuit unit may include a resistor circuit having one end connected to the operating voltage terminal; and a constant voltage circuit connected between another end of the resistor circuit and the gate of the P-channel LD-MOS and configured to turn on depending on the source-gate voltage of the P-channel LD-MOS to maintain the constant voltage between the operating voltage terminal and the gate of the P-channel LD-MOS.

The resistor circuit may include a first resistor; the constant voltage circuit may include a Zener diode; and a sum of a breakdown voltage of the Zener diode and a voltage across the first resistor may be lower than a source-gate breakdown voltage of the P-channel LD-MOS.

The current control circuit may include a second PMOS having a source connected to the operating voltage terminal, a gate connected to a connection node between the constant voltage circuit and the resistor circuit, and a drain; and a third resistor connected between the drain of the second PMOS and the ground and configured to provide the current control signal to the current adjusting circuit.

The current adjusting circuit may include a first NMOS, a second resistor, and a first PMOS connected to each other in series between the gate of the P-channel LD-MOS and the ground; the first NMOS may be configured to operate in a turned-on state or a turned-off state depending on the control voltage; and the first PMOS may be configured to operate in synchronization with an operation of the first NMOS and reduce the operating current flowing to the ground depending on a voltage level of the current control signal.

In another general aspect, a driving circuit includes a first switching element including a first terminal connected to an operating voltage terminal, a second terminal connected to an output voltage terminal, and a control terminal configured to receive a first control voltage and open or close a connection between the first terminal and the second terminal depending on the first control voltage; and a control circuit configured to supply the first control voltage to the control terminal, and adjust an operating current of the control circuit according to a voltage between the first terminal and the control terminal.

The control circuit may be further configured to cause a first operating current to flow from the operating voltage terminal, through a parasitic capacitance between the first terminal and the control terminal, through the control circuit, and to a ground in response to the voltage between the first terminal and the control terminal being less than a predetermined voltage; and cause a second operating current to flow from the operating voltage terminal, through the control circuit, and to the ground in response to the voltage between the first terminal and the control terminal being greater than or equal to the predetermined voltage.

The second operating current may be smaller than the first operating current.

The control circuit may include a resistor having one end connected to the operating voltage terminal; and a constant voltage element connected between another end of the resistor and the first terminal and configured to limit a voltage across the constant voltage element to the predetermined voltage.

The constant voltage element may be a Zener diode having a breakdown voltage equal to the predetermined voltage.

The driving circuit may further include a second switching element having a first terminal connected to the ground, a second terminal connected to the output terminal, and a control terminal configured to receive a second control voltage and open or close a connection between the first terminal of the second switching element and the second terminal of the second switching element depending on the second control voltage; and the control circuit may be further configured to supply the second control voltage to the control terminal of the second switching element.

The control circuit may be further configured to receive an input control voltage from an input terminal, and generate the first control voltage and the second control voltage from the input terminal so that the connection between the first terminal of the second switching element and the second terminal of the second switching element is closed while the connection between the first terminal of the first switching element and the second terminal of the first switching element is open, and the connection between the first terminal of the second switching element and the second terminal of the second switching element is open while the connection between the first terminal of the first switching element and the second terminal of the first switching element is closed.

The first switching element may be a P-channel lateral double-diffused metal-oxide-semiconductor (LD-MOS); the first terminal of the first switching element may be a source of the P-channel LD-MOS; the second terminal of the first switching element may be a drain of the P-channel LD-MOS; the control terminal of the first switching element may be a gate of the P-channel LD-MOS; the second switching element may be an N-channel LD-MOS; the first terminal of the second switching element may be a source of the N-channel LD-MOS; the second terminal of the second switching element may be a drain of the N-channel LD-MOS; and the control terminal of the second switching element may be a gate of the N-channel LD-MOS.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
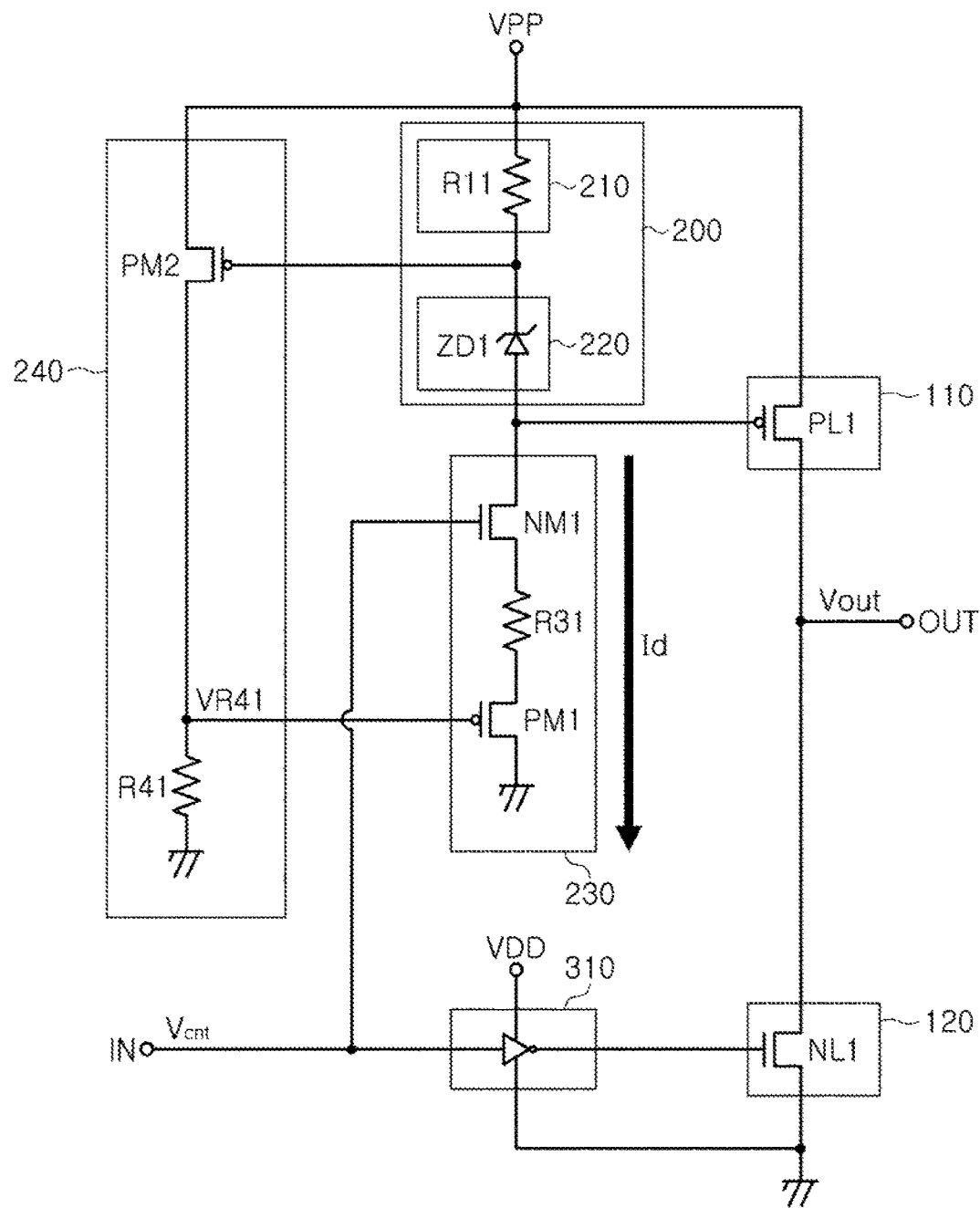
FIG. 1 is a block diagram of an example of a driving circuit.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Throughout the specification, when an element, such as a layer, region, or wafer (substrate), is described as being "on," "connected to," or "coupled to" another element, it can be directly "on," "connected to," or "coupled to" the other element, or there may be other elements intervening therebetween. In contrast, when an element is referred to as being "directly on," "directly connected to," or "directly coupled to" another element, there can be no other elements or layers intervening therebetween. As used herein, the term "and/or" includes any and all combinations of one or more of the associated listed items.

Although terms such as "first," "second," and "third" may be used herein to describe various members, components, regions, layers, and/or sections, these members, components, regions, layers, and/or sections are not to be limited by these terms. Rather, these terms are only used to distinguish one member, component, region, layer, or section from another member, component, region, layer, or section. Thus, a first member, component, region, layer, or section referred to in an example below could also be referred to as a second member, component, region, layer, or section without departing from the teachings of the example.

Spatially relative terms, such as "above," "upper," "below," and "lower," may be used herein for ease of description to describe one element's relationship to another element as shown in the figures. Such spatially relative terms are intended to encompass different orientations of the device in use or operation in addition to the orientation depicted in the figures. For example, if the device in the figures is turned over, elements described as "above" or "upper" relative to other elements would then be oriented "below" or "lower" relative to the other elements. Thus, the term "above" can encompass both the above and below orientations depending on a particular direction of the figures. The device may be otherwise oriented (rotated 90 degrees or at other orientations), and the spatially relative terms used herein are to be interpreted accordingly.

The terminology used herein is for describing particular examples only, and is not intended to limit the disclosure. The terms "a," "an," and "the" include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations in the shapes shown in the drawings may occur. Thus, the examples described below are not to be construed as being limited to the particular shapes of regions shown in the drawings, but include changes in shape occurring during manufacturing.

FIG. 1 is a block diagram of an example of a driving circuit.

Referring to FIG. 1, the driving circuit includes a first switching element 110, a second switching element 120, a constant voltage circuit unit 200, a current adjusting circuit 230, a current control circuit 240, and a signal transfer circuit 310.

The first switching element 110 is connected between an operating voltage (VPP) terminal and an output terminal OUT, and operates in a turned-on state or a turned-off state depending on a control voltage Vcnt received at an input terminal IN.

In one example, the first switching element 110 includes a P-channel lateral double-diffused metal-oxide-semiconductor field-effect transistor (LD-MOS) PL1 connected between the operating voltage (VPP) terminal and the output terminal OUT that operates in a turned-on state or a turned-off state depending on the control voltage Vcnt.

The second switching element 120 is connected between the output terminal OUT and a ground, and operates in a turned-on state or a turned-off state complementarily to the first switching element 110 depending on the control voltage Vcnt. That is, the second switching element 120 operates in the turned-on state while the first switching element 110 operates in the turned-off state, and operates in the turned-on state while the first switching element operates in the turned-off state.

In one example, the second switching element 120 includes an N-channel LD-MOS NL1 connected between the output terminal OUT and the ground that operates complementarily to the P-channel LD-MOS PL1 depending on the control voltage Vcnt.

The constant voltage circuit unit 200 is connected between the operating voltage (VPP) terminal and a gate of the first switching element 110, and is turned on depending on a source-gate voltage Vsg_PL1 of the first switching element to maintain a constant voltage.

In one example, the constant voltage circuit unit 200 includes a resistor circuit 210 and a constant voltage circuit 220.

The resistor circuit 210 has one end connected to the operating voltage (VPP) terminal and another end connected to the constant voltage circuit 220. In one example, the resistor circuit 210 includes a first resistor R11 connected between the operating voltage (VPP) terminal and the constant voltage circuit 220.

The constant voltage circuit 220 is connected between the other end of the resistor circuit 210 and the gate of the first switching element 110, and is turned on depending on the source-gate voltage Vsg_PL1 of the first switching element 110 to maintain the constant voltage. In one example, the constant voltage circuit 220 includes a Zener diode ZD1 having a cathode connected to the other end of the resistor circuit 210 and an anode connected to the gate of the first switching element 110.

In this case, a sum (Vz+VR11) of a breakdown voltage (Vz) of the Zener diode ZD1 and a voltage (VR11) across the first resistor R11 is set to be lower than a source-gate breakdown voltage (BVsg) of the first switching element 110.

The current adjusting circuit 230 is connected between the gate of the first switching element 110 and the ground, operates in a turned-on state or a turned-off state depending on the control voltage Vcnt, and adjusts an operating current Id flowing to the ground depending on a current control signal VR41 based on a level of the source-gate voltage Vsg_PL1 of the first switching element 110 in the turned-on state.

In one example, the current adjusting circuit 230 includes a first N-channel metal-oxide-semiconductor (NMOS) NM1, a second resistor R31, and a first P-channel metal-oxide-semiconductor (PMOS) PM1 connected to each other in series between the gate of the first switching element 110 and the ground.

The first NMOS NM1 operates in a turned-on state or a turned-off state depending on the control voltage Vcnt, and the first PMOS PM1 operates in synchronization with an operation of the first NMOS NM1 and reduces the operating current Id flowing to the ground depending on a voltage level of the current control signal VR41.

The second resistor R31 has a resistance value set according to the following Equation 1:

$$R31 = \frac{Vcnt - Vgs(NM1) - Vsg(PM1)}{I1} \quad (1)$$

In Equation 1, Vcnt is a control voltage, Vgs(NM1) is the source-gate voltage of the first NMOS (NM1), Vsg(PM1) is a source-gate voltage of the first PMOS (PM1), and I1 is a first current.

The current control circuit 240 controls the operating current Id by providing the current control signal VR41 to the current adjusting circuit 230 in a turned-on state of the constant voltage circuit 220.

In one example, the current control circuit 240 includes a second PMOS PM2 and a third resistor R41.

The second PMOS PM2 has a source connected to the operating voltage (VPP) terminal, a gate connected to a connection node between the constant voltage circuit 220 and the resistor circuit 210, and a drain. The third resistor R41 is connected between the drain of the second PMOS PM2 and the ground, and provides the current control signal VR41 to the current adjusting circuit 230.

The signal transfer circuit 310 provides the control voltage Vcnt to a gate of the second switching element 120.

In one example, the signal transfer circuit 310 includes at least one inverter to perform a more stable operation.

Although not illustrated in FIG. 1, the driving circuit may further include an inverter or a buffer disposed at an input side thereof receiving the control voltage Vcnt to perform a more stable operation.

Figure 2:
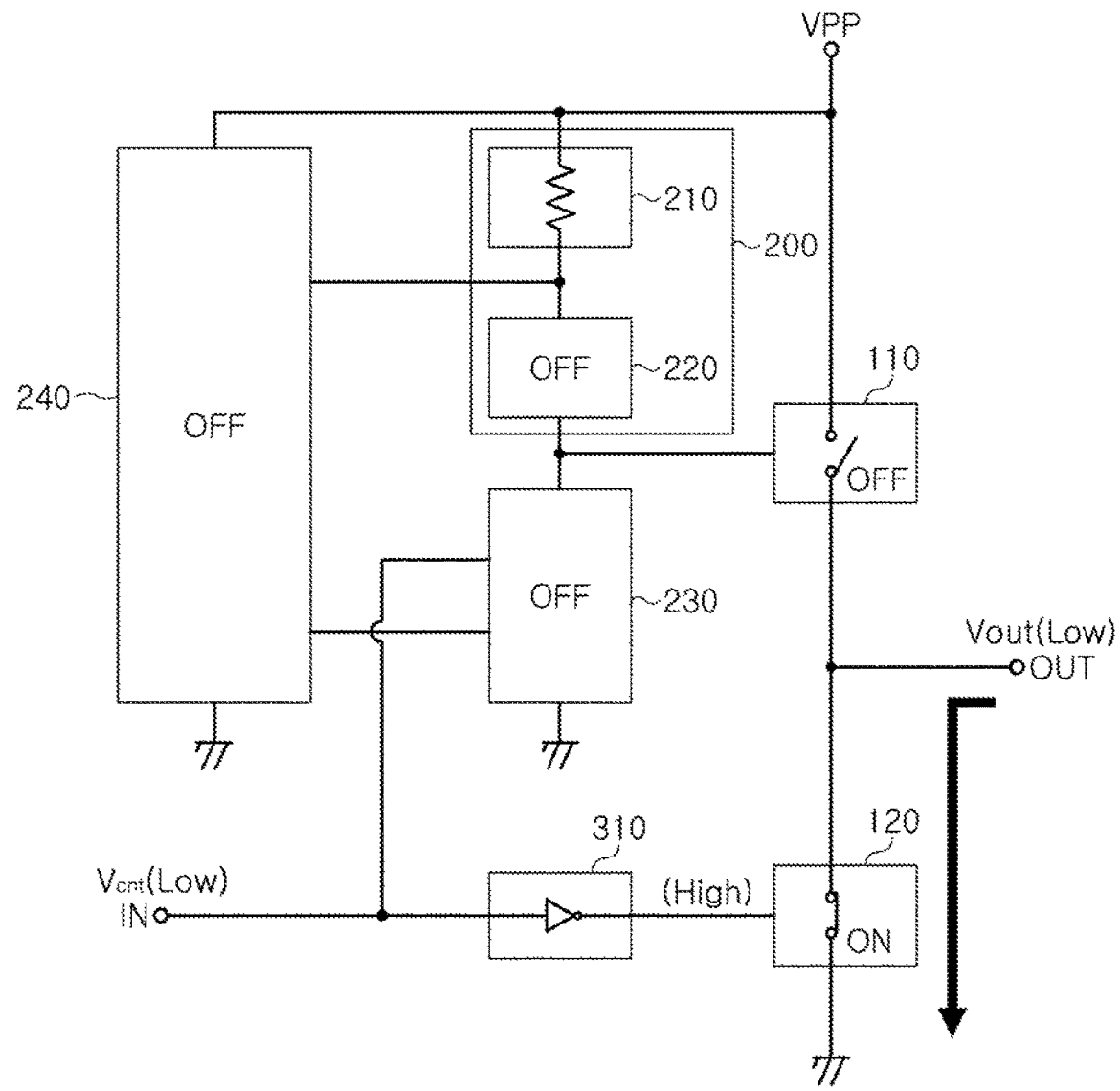
FIG. 2 is a view illustrating an example of a first operation of the driving circuit.
Figure 3:
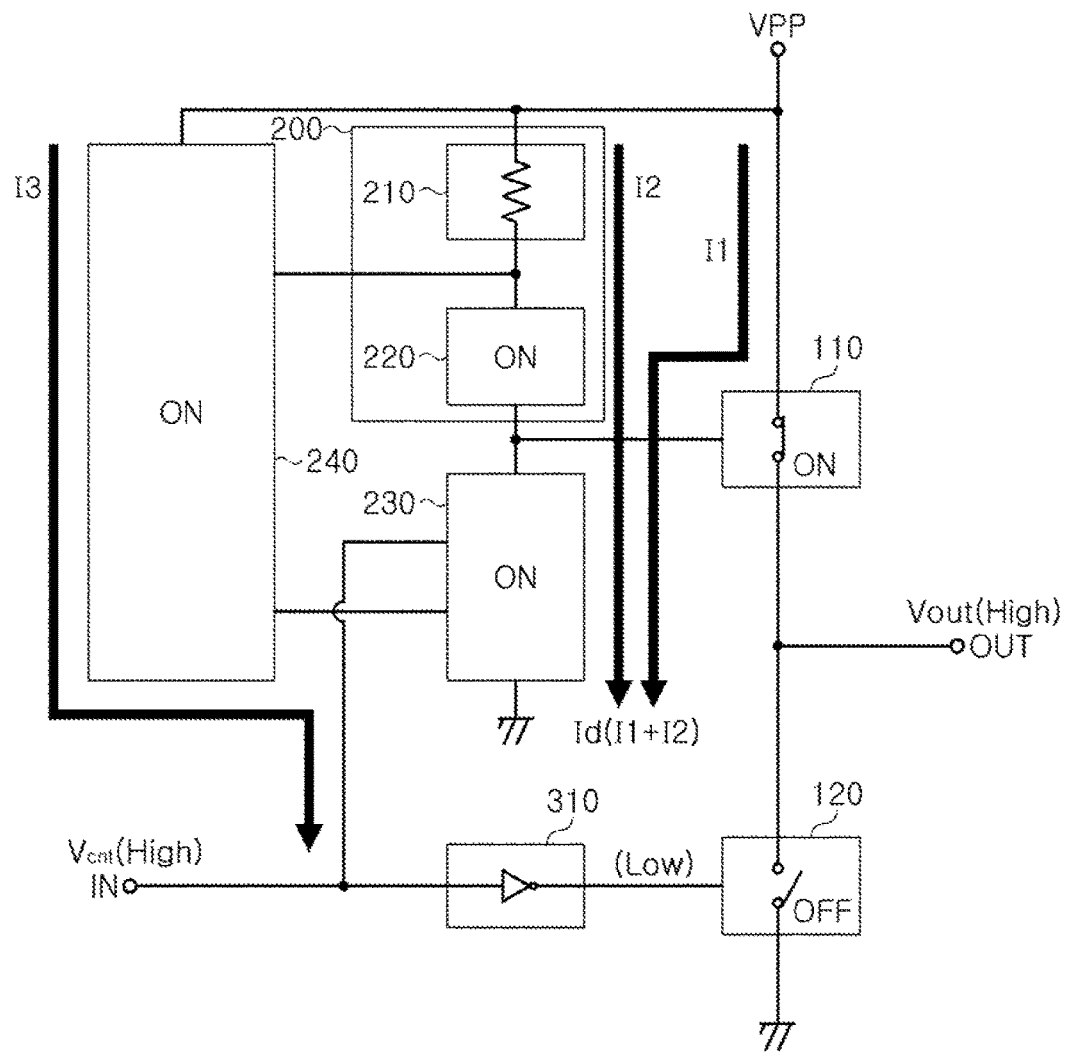
FIG. 3 is a view illustrating an example of a second operation of the driving circuit.

FIG. 2 is a view illustrating an example of a first operation of the driving circuit, and FIG. 3 is a view illustrating an example of a second operation of the driving circuit.

Referring to FIG. 2, in one example, when a voltage level of the control voltage Vcnt is low (for example, 0 V), the first switching element 110, the constant voltage circuit 220, the current adjusting circuit 230, and the current control circuit 240 are turned off, and the second switching element 120 is turned on.

Therefore, an output voltage Vout of the output terminal OUT drops to a low voltage (for example, 0 V).

An example of a first operation of the driving circuit will be described with reference to FIGS. 1 and 2.

First, when a voltage level of the control voltage Vcnt is low, (for example, 0 V), in a case in which the signal transfer circuit 310 includes the inverter, the voltage level of the control voltage Vcnt is inverted by the signal transfer circuit 310 to become high, thereby turning on the second switching element 120 (the N-channel LD-MOS NL1).

In addition, when the voltage level of the control voltage Vcnt is low (for example, 0 V), the first NMOS NM1 of the current adjusting circuit 230 is turned off, thereby preventing a current from flowing between the gate of the first switching element 110 and the ground.

Therefore, the Zener diode ZD1 of the constant voltage circuit 220 is maintained in a turned-off state, thereby preventing a current from flowing through the resistor circuit 210.

Therefore, the first switching element 110 (the P-channel LD-MOS PL1) is turned off, and the current control circuit 240 is also turned-off.

Referring to FIG. 3, in one example, when a voltage level of the control voltage Vcnt is a high level (for example, 10 V), the first switching element 110, the constant voltage circuit 220, the current adjusting circuit 230, and the current control circuit 240 are turned on, and the second switching element 120 is turned off.

Therefore, an output voltage Vout of the output terminal OUT increases to a high level (for example, 60 V).

An example of a second operation of the driving circuit will be described with reference to FIGS. 1 and 3.

Referring to FIGS. 1 and 3, first, when a voltage level of the control voltage Vcnt is high (for example, 10 V), in a case in which the signal transfer circuit 310 includes the inverter, the voltage level of the control voltage Vcnt is inverted by the signal transfer circuit 310 to become low, thereby turning off the second switching element 120 (the N-channel LD-MOS NL1).

In addition, when the voltage level of the control voltage Vcnt is high (for example, 10 V), the first NMOS NM1 of the current adjusting circuit 230 is turned on, and the current control circuit 240 remains in a turned-off state. Therefore, a gate of the first PMOS PM1 of the current adjusting circuit 230 is grounded through the third resistor R41, causing a voltage of a source of the first PMOS PM1 to be larger than the voltage of the gate of the first PMOS PM1 by a turn-on voltage or more. Accordingly, the first PMOS PM1 is turned on.

Therefore, a current flows through the current adjusting circuit 230. In this case, a first current I1 flows through the current adjusting circuit 230 as illustrated in FIG. 3 during a period in which a voltage is charged in a parasitic source-gate capacitor Csg (not shown in FIG. 3, but see FIG. 5) of the P-channel LD-MOS PL1 (the first switching element 110).

As a charging voltage of the source-gate capacitor Csg of the P-channel LD-MOS PL1 rises, a voltage across the Zener diode ZD1 included in the constant voltage circuit 220 becomes equal to the breakdown voltage (Vz) of the Zener diode ZD1, causing the Zener diode ZD1 to turn on and limit the voltage across the Zener diode ZD1 to the breakdown voltage (Vz) of the Zener diode ZD1, thereby causing a current to flow through the resistor circuit 210.

The current flowing through the resistor circuit 210 causes a voltage across the resistor circuit 210 to reach a level of a turn-on voltage or more of the second PMOS PM2 of the current control circuit 240, thereby turning on the second PMOS PM2. Therefore, a third current I3 flows through the third resistor R41, causing a voltage of the current control signal VR41 to rise, causing the first PMOS PM1 to be weakly turned on, thereby reducing an amount of current flowing through the current adjusting circuit 230 to I2.

The breakdown voltage (Vz) of the Zener diode ZD1 is a voltage across the Zener diode ZD1 at which the Zener diode ZD1 turns on. The voltage across the Zener diode ZD1 remains constant at the breakdown voltage (Vz). That is, the Zener diode ZD1 limits the voltage across the Zener diode ZD1 to the breakdown voltage (Vz). The source-gate breakdown voltage BVsg of a transistor such as the first switching element 110 is a maximum reverse voltage that the transistor can withstand, Referring to FIGS. 1 and 3, the operating current Id includes the first current I1 and the second current I2.

Referring to FIG. 3, the first current I1 flows to the ground through the parasitic capacitor Csg between the source and the gate of the first switching element 110 and the current adjusting circuit 230 in a turned-off state of the constant voltage circuit 220.

The second current I2 flows to the ground through the resistor circuit 210, the constant voltage circuit 220, and the current adjusting circuit 230 in a turned-on state of the constant voltage circuit 220.

Referring to FIGS. 2 and 3, a value of the second current I2 is set to be lower than a value of the first current I1.

Figure 4:
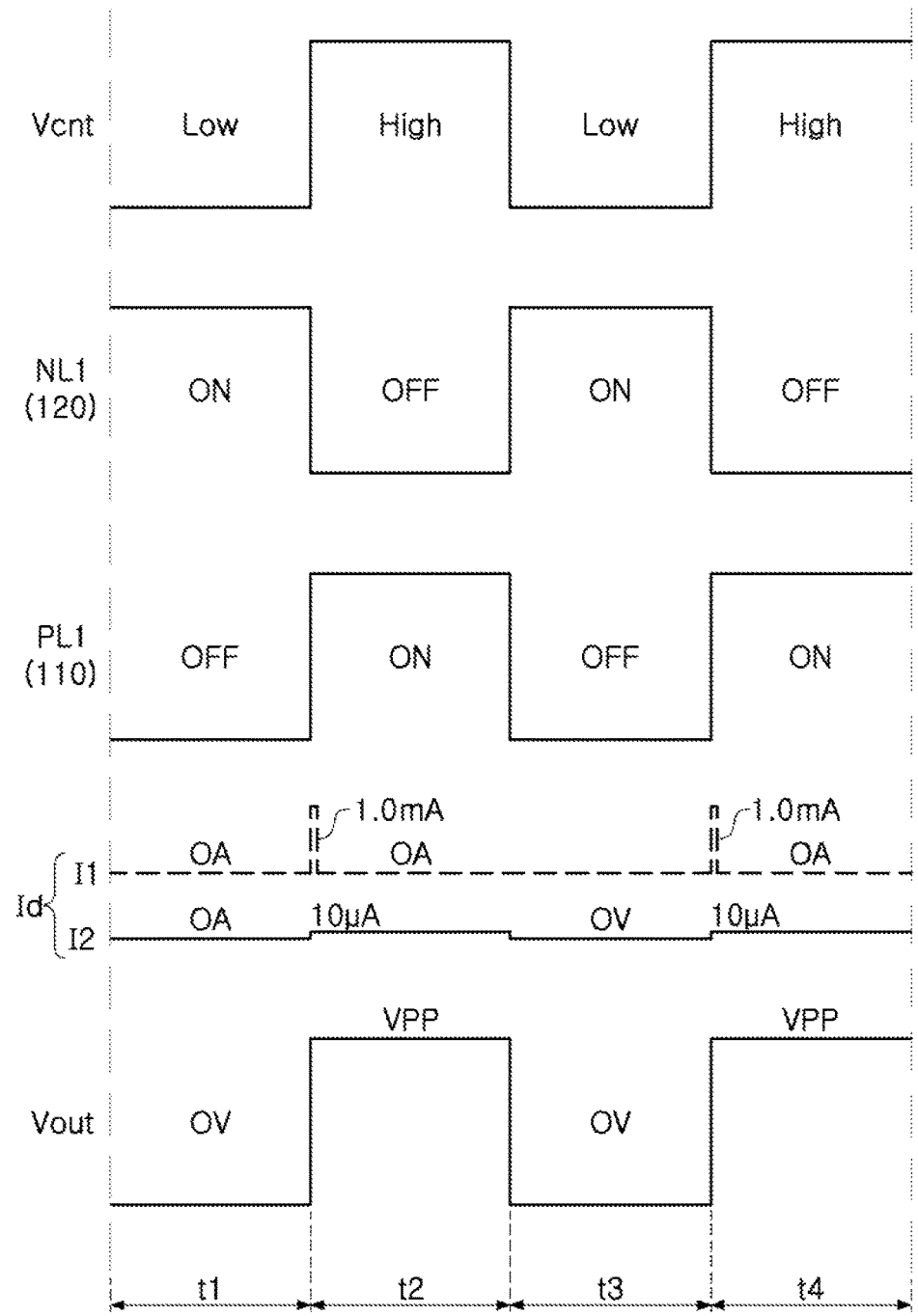
FIG. 4 shows timing charts illustrating an example of an operation of the driving circuit.

FIG. 4 shows timing charts illustrating an example of an operation of the driving circuit.

Referring to FIG. 4, a control voltage Vcnt alternates between a low level (for example, 0 V) and a high level (for example, 10 V). Therefore, the P-channel LD-MOS PL1 and the N-channel LD-MOS NL1 operate complementarily to each other in synchronization with the levels of the control voltage Vcnt, a first current I1 flows at a rising edge of the control voltage Vcnt, and a second current I2 flows during the high period of the control voltage Vcnt.

Therefore, an output voltage Vout has a high level (VPP, for example, 60 V) or a low level (for example, 0 V) depending on the control voltage Vcnt.

Reference numerals t1, t2, t3, and t4 illustrated in FIG. 4 denote different operation sections. In sections t2 and t4, the first current I1 flows at a rising edge of Vcnt while the P-channel LD-MOS PL1 is turning on, and the second current I2 flows in sections t2 and t4 while the P-channel LD-MOS PL1 is in a turned-on state.

Figure 5:
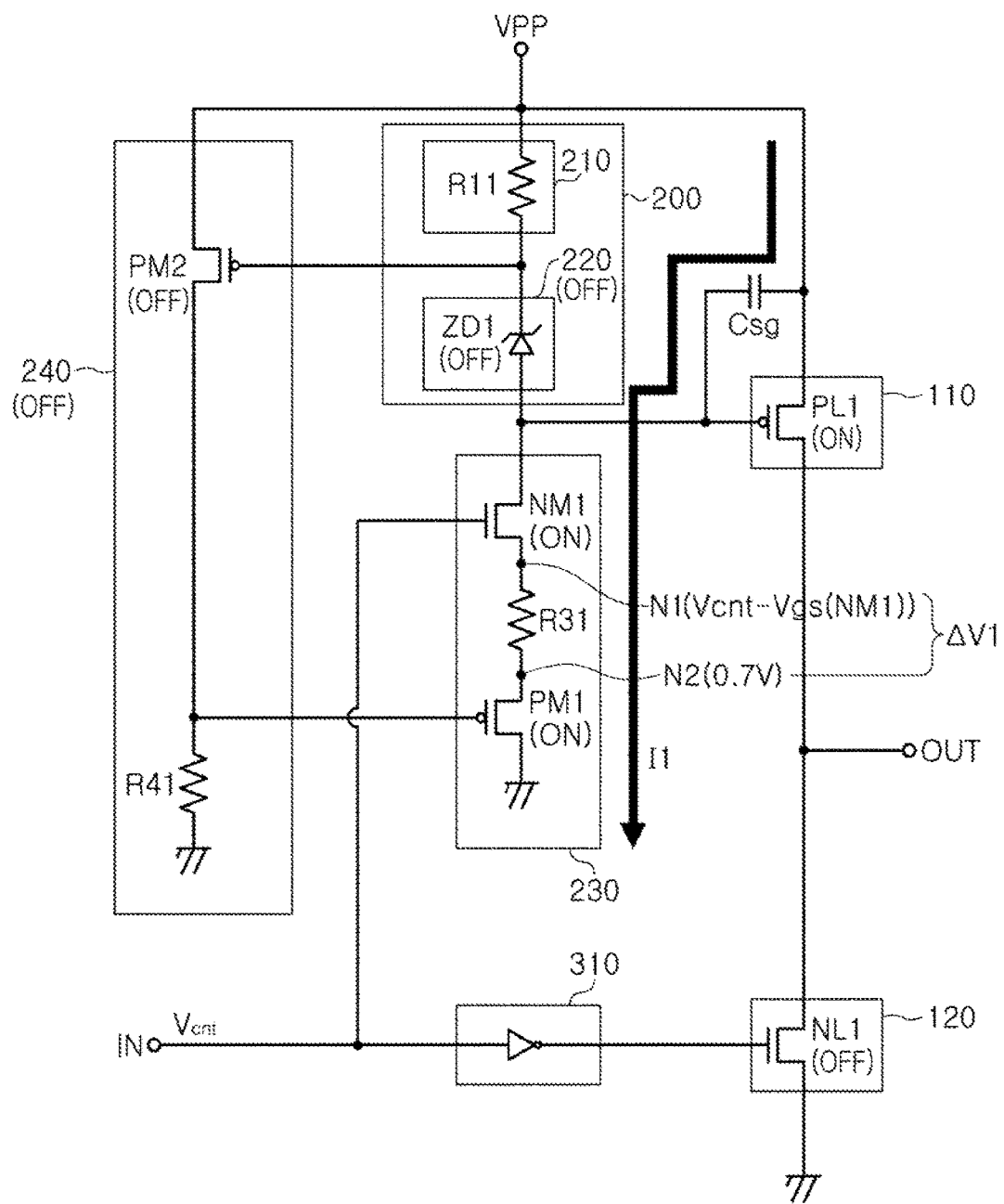
FIG. 5 is a view illustrating an example of an operation for a first current in the second operation of the driving circuit.
Figure 6:
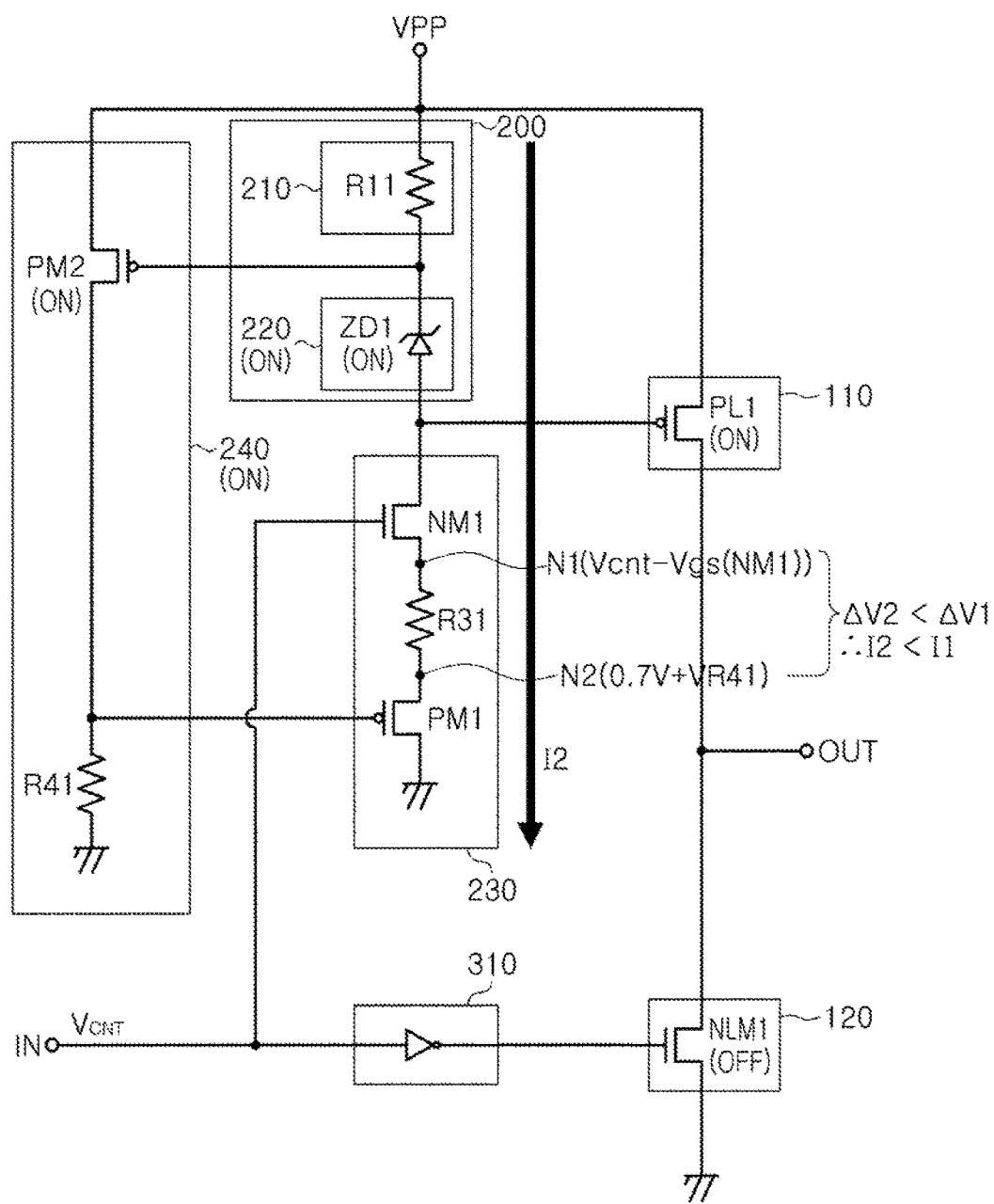
FIG. 6 is a view illustrating an example of an operation for a second current in the second operation of the driving circuit.

FIG. 5 is a view illustrating an example of an operation for a first current in the second operation of the driving circuit, and FIG. 6 is a view illustrating an example of an operation for a second current in the second operation of the driving circuit.

An example of an operation for a first current in the second operation of the driving circuit will be described with reference to FIG. 5.

Referring to FIG. 5, as described above, the first current I1 flows through the current adjusting circuit 230 as illustrated in FIG. 3 during the period in which the voltage is charged in the source-gate capacitor Csg of the P-channel LD-MOS PL1 (the first switching element 110).

In a case in which the first current I1 flows through the current adjusting circuit 230, a voltage across the second resistor R31 is as follows.

For example, when a high level of the control voltage Vcnt is 10 V, a gate voltage of the first NMOS NM1 is 10 V, and when a turn-on voltage of the first NMOS NM1 is 0.7 V, a source voltage of the first NMOS NM1 is 9.3 V. That is, a voltage of one end node N1 of the second resistor R31 connected to a source of the first NMOS NM1 is 9.3 V.

When a low level of the current control signal Vcnt is 0 V, a gate voltage of the first PMOS PM1 is 0 V, and thus a source voltage of the first PMOS PM1 is 0.7 V, which is higher than the gate voltage of 0 V of the first PMOS PM1 by a turn-on voltage of 0.7 V of the first PMOS PM1. That is, a voltage of the other end node N2 of the second resistor R31 connected to the source of the first PMOS PM1 is 0.7 V. In this case, a voltage (ΔV1) across the second resistor R31 is 8.6 V.

An example of an operation for a second current in the second operation of the driving circuit will be described with reference to FIG. 6.

As described above, the second PMOS PM2 of the current control circuit 240 is turned on, causing the third current I3 to through the third resistor R41.

In this case, a resistance value of the third resistor R41 is set according to the following Equation 2:

$$R41 = \frac{VR41}{I3} \qquad (2)$$

In Equation 2, VR41 is a value of a voltage across the third resistor R41, and I3 is a value of the third current.

In this case, the current control signal VR41 is applied to the gate of the first PMOS PM1 included in the current adjusting circuit 230, thereby reducing a voltage across the second resistor R31 of the current adjusting circuit 230. Since a resistance value of the second resistor R31 is fixed, the first current I1 flowing through the current adjusting circuit 230 is reduced to the second current (I2=VR31/R31).

In a case in which the second current I2 flows through the current adjusting circuit 230, a voltage across the second resistor R31 is as follows.

For example, when a high level of the control voltage Vcnt is 10 V, a gate voltage of the first NMOS NM1 is 10 V, and when a turn-on voltage of the first NMOS NM1 is 0.7 V, a source voltage of the first NMOS NM1 is 9.3 V. That is, a voltage of one end node N1 of the second resistor R31 is 9.3 V.

In a case in which a voltage level of the current control signal VR41 is 8.51 V, a gate voltage of the first PMOS PM1 is 8.51 V, and thus a source voltage of the first PMOS PM1 is 9.21 V, which is higher than the gate voltage of 8.51 V of the first PMOS PM1 by a turn-on voltage of 0.7 V of the first PMOS PM1. That is, a voltage of the other end node N2 of the second resistor R31 is 9.21 V. In this case, a voltage ($\Delta V2$) across the second resistor R31 is 0.09 V.

In one example, the first current I1 is 8.6 V/R31, and the second current I2 is 0.09 V/R31. In this case, when R31 is 8.3 k$\Omega$, the first current I1 is 1.036 mA, or approximately 1.0 mA in the following discussion, and the second current I2 is 10.84 $\mu$A, or approximately 10 $\mu$A in the following discussion.

Figure 7:
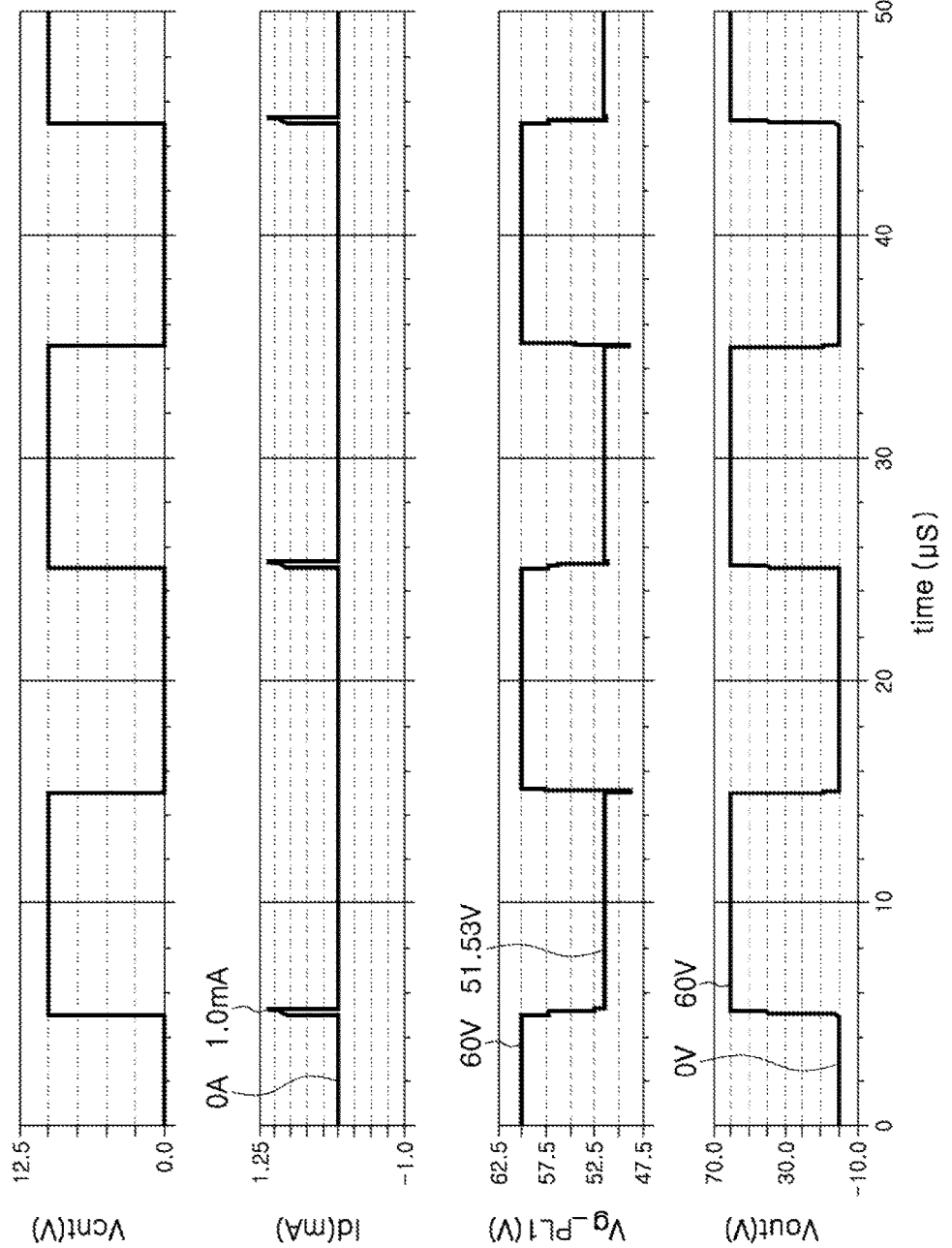
FIG. 7 shows waveform diagrams illustrating examples of a control voltage Vcnt, an operating current Id, a gate voltage Vg_PL1 of a first switching element, and an output voltage Vout.

FIG. 7 shows waveform diagrams illustrating examples of the control voltage Vcnt, the operating current Id, the gate voltage Vg_PL1 of the first switching element 110 (the P-channel LD-MOS PL1), and the output voltage Vout.

Referring to FIG. 7, an output voltage Vout of 60 V is provided by a control voltage Vcnt of 10 V as an example, a first current I1 (=1 mA) instantaneously flows when the control voltage Vcnt changes from a low level to a high level, and a second current I2 (=10 $\mu$A) flows when the P-channel LD-MOS PL1 is completely turned on. In addition, while the control voltage Vcnt remains at the high level, the gate voltage Vg_PL1 of the P-channel LD-MOS PL1 is 51.53 V, the source-gate voltage Vsg_PL1 of the P-channel LD-MOS PL1 is 8.47 V (60 V-51.53 V), and a minimum value of the source-gate breakdown voltage BVsg of the P-channel LD-MOS PL1 is lower than 15 V.

Figure 8:
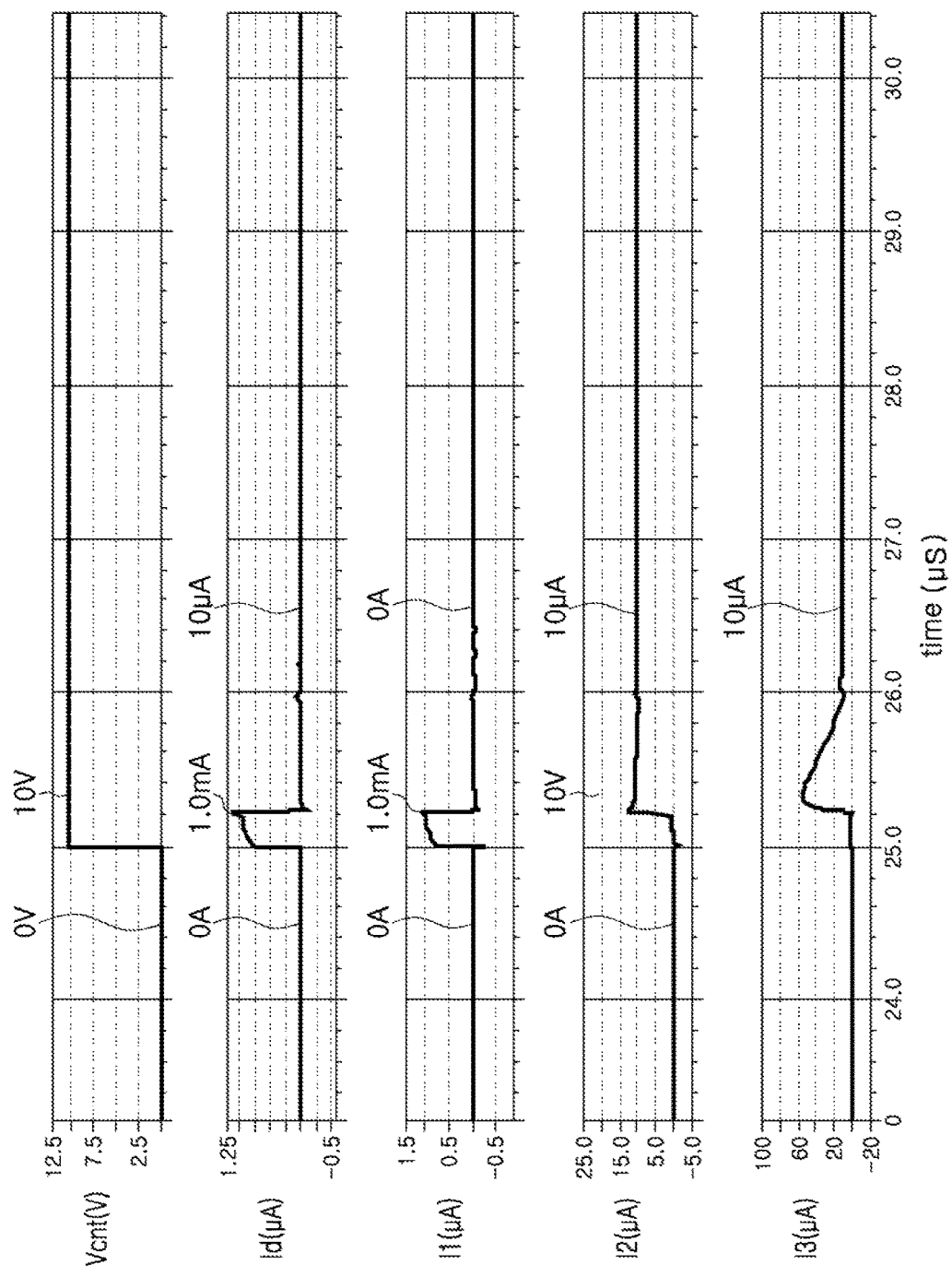
FIG. 8 shows waveform diagrams illustrating examples of a control voltage Vcnt, an operating current Id, a first current I1, a second current I2, and a third current I3.

FIG. 8 shows waveform diagrams illustrating examples of the control voltage Vcnt, the operating current Id, the first current I1, the second current I2, and the third current I3.

Referring to FIG. 8, it when the control voltage Vcnt changes from a low level to a high level, an operating current Id flowing through the second resistor R31 is the first current I1 of approximately 1 mA for approximately 200 ns and is reduced to the second current I2 of approximately 10 $\mu$A after 200 ns. When the control voltage Vcnt changes from the low level to the high level, the gate voltage of the first PMOS PM1 is 0 V for approximately 200 ns after the control voltage Vcnt changes to the high level, and thus the first current I1 (=1 mA), a large current, flows as the operating current Id, and the first PMOS PM1 is rapidly turned on. Then, a voltage level of the current control signal VR41 of the current control circuit 240 produced by the third resistor R41 rises when the second PMOS PM2 turns on. Therefore, the gate voltage of the first PMOS PM1 rises, and thus first PMOS PM1 is weakly turned on, reducing the operating current Id from the first current I1 (=1 mA) to the second current I2 (=10 $\mu$A).

A change of the operating current Id from the first current I1 to the second current I2 means that the parasitic capacitor Csg of the P-channel LD-MOS PL1 is charged with the breakdown voltage Vz of the Zener diode ZD1, causing the P-channel LD-MOS PL1 to switch to a stable turned-on state.

Figure 9:
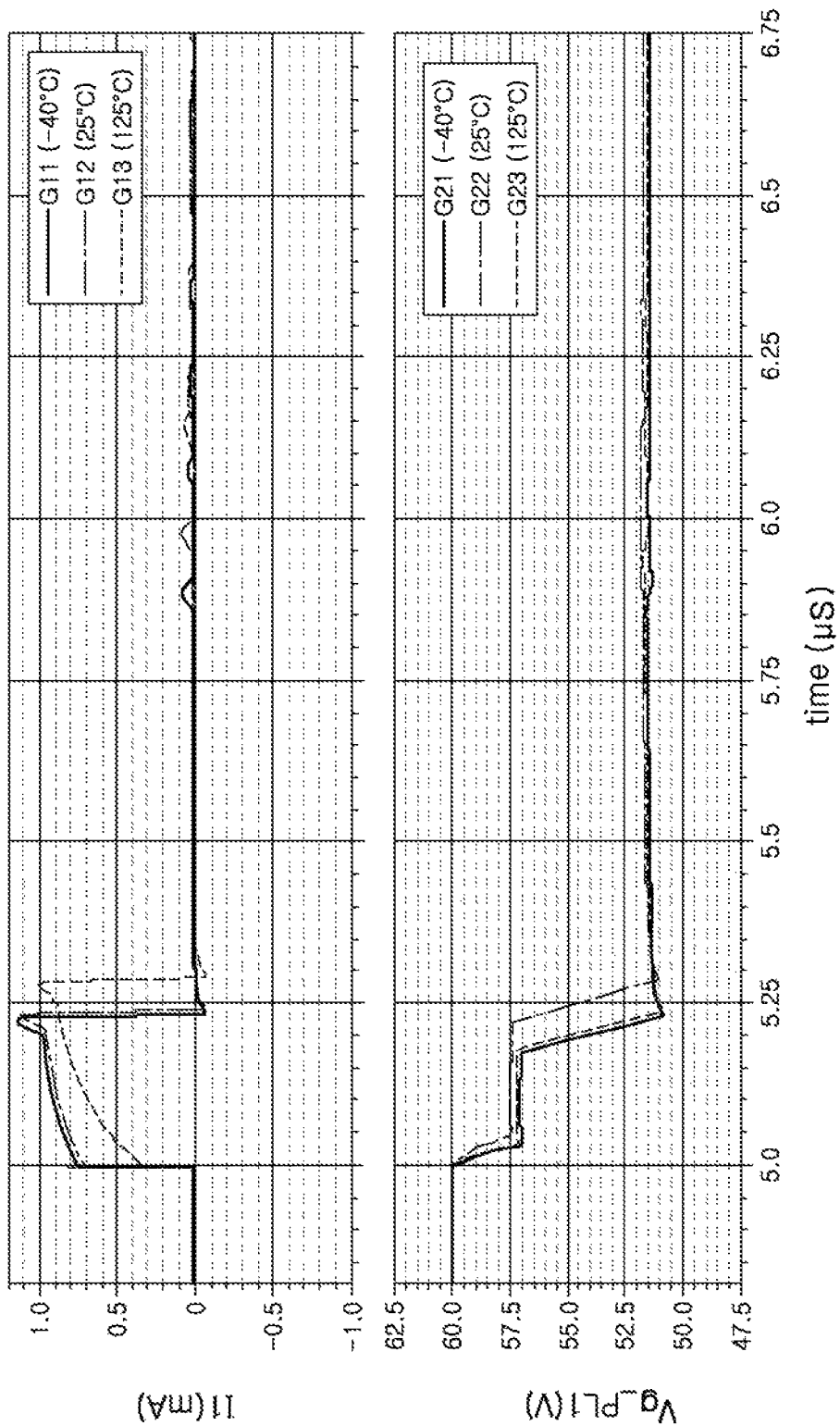
FIG. 9 shows waveform diagrams illustrating examples of variations in a first current I1 and a gate voltage Vg_PL1 of a first switching element depending on a temperature variation.
Figure 10:
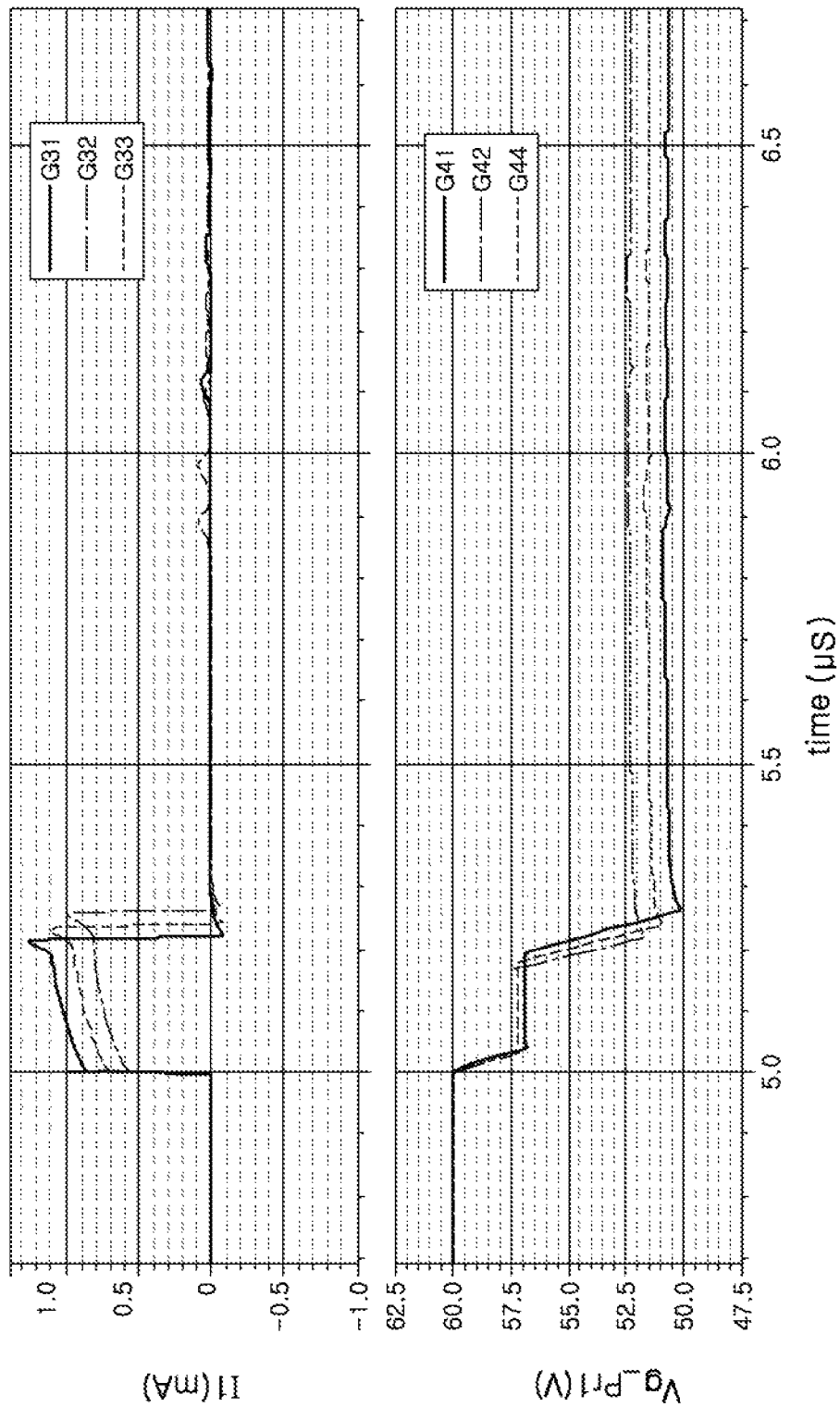
FIG. 10 shows waveform diagrams illustrating examples of variations in a first current I1 and a gate voltage Vg_PL1 of a first switching element depending on a process variation.

FIG. 9 shows waveform diagrams illustrating examples of variations in the first current I1 and the gate voltage Vg_PL1 of the first switching element 110 (the P-channel LD-MOS PL1) depending on a temperature variation, and FIG. 10 shows waveform diagrams illustrating examples of variations in the first current I1 and the gate voltage Vg_PL1 of the first switching element 110 (the P-channel LD-MOS PL1) depending on a process variation.

G11, G12, and G13 of FIG. 9 are waveform diagrams of first currents I1 at temperatures of −40° C., 25° C., and 125° C., respectively, and G21, G22, and G23 of FIG. 9 are waveform diagrams of gate voltages Vg_PL1 of the first switching element 110 (the P-channel LD-MOS PL1) at temperatures of −40° C., 25° C., and 125° C., respectively.

G31, G32, and G33 of FIG. 10 are waveform diagrams of first currents I1 depending on a process variation (typical/fast/slow process variation), respectively, and G41, G42, and G43 of FIG. 10 are waveform diagrams of gate voltages Vg_PL1 of the first switching element 110 (the P-channel LD-MOS PL1) depending on a process variation (typical/fast/slow process variation), respectively.

As illustrated in FIGS. 9 and 10, even though the first current I1 changes, a pulse width of the first current I1 is automatically adjusted and a change from the first current I1 to the second current I2 is automatically made depending on a temperature variation of −40° C. to 125° C. illustrated in FIG. 9 and a process variation illustrated in FIG. 10.

As described above, a change from the first current I1 enabling the P-channel LD-MOS PL1 to rapidly turn on to the second current I2 for maintaining the P-channel LD-MOS PL1 in the turned-on state is automatically adjusted by feedback, which makes a process of forcibly adjusting a pulse width as in an existing circuit unnecessary, and the driving circuit insensitive to temperature and process variations. In addition, as described above, the first current I1 is large, and the second current I2 and the third current I3 are small, enabling a switching operation to be performed relatively quickly and reducing a power consumption.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:
1. A driving circuit comprising:
a first switching element connected between an operating voltage terminal and an output terminal and configured to operate in a turned-on state or a turned-off state depending on a control voltage;

a second switching element connected between the output terminal and a ground and configured to operate in a turned-on state or a turned-off state complementarily to the first switching element depending on the control voltage;

a constant voltage circuit unit connected between the operating voltage terminal and a gate of the first switching element and configured to turn on depending on a source-gate voltage of the first switching element to maintain a constant voltage between the operating voltage terminal and the gate of the first switching element;

a current adjusting circuit connected between the gate of the first switching element and the ground and configured to operate in a turned-on state or a turned-off state depending on the control voltage, and adjust an operating current flowing to the ground depending on a current control signal based on a level of the source-gate voltage of the first switching element in the turned-on state of the current adjusting unit;

a current control circuit configured to control the operating current by providing the current control signal to the current adjusting circuit in a turned-on state of the constant voltage circuit unit; and a signal transfer circuit configured to provide the control voltage to a gate of the second switching element;

wherein the operating current comprises:
a first current flowing to the ground through a parasitic capacitor between a source and the gate of the first switching element and the current adjusting circuit in a turned-off state of the constant voltage circuit unit; and
a second current flowing to the ground through the constant voltage circuit unit and the current adjusting circuit in the turned-on state of the constant voltage circuit unit; and
a value of the second current is less than a value of the first current.

2. The driving circuit of claim 1, wherein the constant voltage circuit unit comprises:
a resistor circuit having one end connected to the operating voltage terminal; and
a constant voltage circuit connected between another end of the resistor circuit and the gate of the first switching element and configured to turn on depending on the source-gate voltage of the first switching element to maintain the constant voltage between the operating voltage terminal and the gate of the first switching element.

3. The driving circuit of claim 2, wherein the resistor circuit comprises a first resistor;
the constant voltage circuit comprises a Zener diode; and
a sum of a breakdown voltage of the Zener diode and a voltage across the first resistor is lower than a source-gate breakdown voltage of the first switching element.

4. The driving circuit of claim 2, wherein the current control circuit comprises:
a second PMOS having a source connected to the operating voltage terminal, a gate connected to a connection node between the constant voltage circuit and the resistor circuit, and a drain; and
a third resistor connected between the drain of the second PMOS and the ground and configured to provide the current control signal to the current adjusting circuit.

5. The driving circuit of claim 1, wherein the current adjusting circuit comprises a first N-channel metal-oxide-semiconductor (NMOS), a second resistor, and a first P-channel metal-oxide-semiconductor (PMOS) connected to each other in series between the gate of the first switching element and the ground;
the first NMOS is configured to operate in a turned-on state or a turned-off state depending on the control voltage; and
the first PMOS is configured to operate in synchronization with an operation of the first NMOS and reduce the operating current flowing to the ground depending on a voltage level of the current control signal.

6. A driving circuit comprising:
a P-channel lateral double-diffused metal-oxide-semiconductor (LD-MOS) connected between an operating voltage terminal and an output terminal and configured to operate in a turned-on state or a turned-off state depending on a control voltage;

an N-channel LD-MOS connected between the output terminal and a ground and configured to operate complementarily to the P-channel LD-MOS depending on the control voltage;

a constant voltage circuit unit connected between the operating voltage terminal and a gate of the P-channel LD-MOS and configured to turn on depending on a source-gate voltage of the P-channel LD-MOS to maintain a constant voltage between the operating voltage terminal and the gate of the P-channel LD-MOS;

a current adjusting circuit connected between the gate of the P-channel LD-MOS and the ground and configured to operate in a turned-on state or a turned-off state depending on the control voltage, and adjust an operating current flowing to the ground depending on a current control signal based on a level of the source-gate voltage of the P-channel LD-MOS in the turned-on state of the current adjusting unit;

a current control circuit configured to control the operating current by providing the current control signal to the current adjusting circuit in a turned-on state of the constant voltage circuit unit; and a signal transfer circuit configured to provide the control voltage to a gate of the N-channel LD-MOS;

wherein the operating current comprises:
a first current flowing to the ground through a parasitic capacitor between a source and the gate of the P-channel LD-MOS and the current adjusting circuit in a turned-off state of the constant voltage circuit unit; and
a second current flowing to the ground through the constant voltage circuit unit and the current adjusting circuit in the turned-on state of the constant voltage circuit unit; and
a value of the second current is lower than a value of the first current.

7. The driving circuit of claim 6, wherein the constant voltage circuit unit comprises:
a resistor circuit having one end connected to the operating voltage terminal; and
a constant voltage circuit connected between another end of the resistor circuit and the gate of the P-channel LD-MOS and configured to turn on depending on the source-gate voltage of the P-channel LD-MOS to maintain the constant voltage between the operating voltage terminal and the gate of the P-channel LD-MOS.

8. The driving circuit of claim 7, wherein the resistor circuit comprises a first resistor;

the constant voltage circuit comprises a Zener diode; and
a sum of a breakdown voltage of the Zener diode and a voltage across the first resistor is lower than a source-gate breakdown voltage of the P-channel LD-MOS.

9. The driving circuit of claim 7, wherein the current control circuit comprises:
a second PMOS having a source connected to the operating voltage terminal, a gate connected to a connection node between the constant voltage circuit and the resistor circuit, and a drain; and
a third resistor connected between the drain of the second PMOS and the ground and configured to provide the current control signal to the current adjusting circuit.

10. The driving circuit of claim 6, wherein the current adjusting circuit comprises a first NMOS, a second resistor, and a first PMOS connected to each other in series between the gate of the P-channel LD-MOS and the ground;
the first NMOS is configured to operate in a turned-on state or a turned-off state depending on the control voltage; and
the first PMOS is configured to operate in synchronization with an operation of the first NMOS and reduce the operating current flowing to the ground depending on a voltage level of the current control signal.

11. A driving circuit comprising:
a first switching element comprising a first terminal connected to an operating voltage terminal, a second terminal connected to an output voltage terminal, and a control terminal configured to receive a first control voltage and open or close a connection between the first terminal and the second terminal depending on the first control voltage; and
a control circuit configured to supply the first control voltage to the control terminal, and adjust an operating current of the control circuit according to a voltage between the first terminal and the control terminal;
wherein the control circuit is further configured to:
cause a first operating current to flow from the operating voltage terminal, through a parasitic capacitance between the first terminal and the control terminal, through the control circuit, and to a ground in response to the voltage between the first terminal and the control terminal being less than a predetermined voltage; and
cause a second operating current to flow from the operating voltage terminal, through the control circuit, and to the ground in response to the voltage between the first terminal and the control terminal being greater than or equal to the predetermined voltage; and
the second operating current is smaller than the first operating current.

12. The driving circuit of claim 11, wherein the control circuit comprises:
a resistor having one end connected to the operating voltage terminal; and
a constant voltage element connected between another end of the resistor and the first terminal and configured to limit a voltage across the constant voltage element to the predetermined voltage.

13. The driving circuit of claim 12, wherein the constant voltage element is a Zener diode having a breakdown voltage equal to the predetermined voltage.

14. The driving circuit of claim 11, further comprising a second switching element having a first terminal connected to the ground, a second terminal connected to the output terminal, and a control terminal configured to receive a second control voltage and open or close a connection between the first terminal of the second switching element and the second terminal of the second switching element depending on the second control voltage;
wherein the control circuit is further configured to supply the second control voltage to the control terminal of the second switching element.

15. The driving circuit of claim 14, wherein the control circuit is further configured to receive an input control voltage from an input terminal, and generate the first control voltage and the second control voltage from the input terminal so that the connection between the first terminal of the second switching element and the second terminal of the second switching element is closed while the connection between the first terminal of the first switching element and the second terminal of the first switching element is open, and the connection between the first terminal of the second switching element and the second terminal of the second switching element is open while the connection between the first terminal of the first switching element and the second terminal of the first switching element is closed.

16. The driving circuit of claim 14, wherein the first switching element is a P-channel lateral double-diffused metal-oxide-semiconductor (LD-MOS);
the first terminal of the first switching element is a source of the P-channel LD-MOS;
the second terminal of the first switching element is a drain of the P-channel LD-MOS;
the control terminal of the first switching element is a gate of the P-channel LD-MOS;
the second switching element is an N-channel LD-MOS;
the first terminal of the second switching element is a source of the N-channel LD-MOS;
the second terminal of the second switching element is a drain of the N-channel LD-MOS;a and
the control terminal of the second switching element is a gate of the N-channel LD-MOS.

* * * * *